(12) United States Patent
Kim et al.

(10) Patent No.: US 11,942,128 B2
(45) Date of Patent: Mar. 26, 2024

(54) MAGNETIC MEMORY DEVICE

(71) Applicant: Samsung Electronics Co., Ltd., Suwon-si (KR)

(72) Inventors: Whankyun Kim, Seoul (KR); Jeong-Heon Park, Hwaseong-si (KR); Heeju Shin, Seoul (KR); Youngjun Cho, Hwaseong-si (KR); Joonmyoung Lee, Gwacheon-si (KR); Junho Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 155 days.

(21) Appl. No.: 17/576,047

(22) Filed: Jan. 14, 2022

(65) Prior Publication Data

US 2022/0383923 A1 Dec. 1, 2022

(30) Foreign Application Priority Data

May 27, 2021 (KR) .................. 10-2021-0068636

(51) Int. Cl.
| | |
|---|---|
| *G11C 11/16* | (2006.01) |
| *H10B 61/00* | (2023.01) |
| *H10N 50/10* | (2023.01) |
| *H10N 50/80* | (2023.01) |
| *H10N 50/85* | (2023.01) |

(52) U.S. Cl.
CPC ............ *G11C 11/161* (2013.01); *H10B 61/00* (2023.02); *H10N 50/10* (2023.02); *H10N 50/80* (2023.02); *H10N 50/85* (2023.02)

(58) Field of Classification Search
CPC ...... G11C 11/161; H10B 61/00; H10N 50/80; H10N 50/85; H01N 50/10
USPC ........................................................ 365/158
See application file for complete search history.

(56) References Cited

U.S. PATENT DOCUMENTS

| | | |
|---|---|---|
| 7,476,954 B2 | 1/2009 | Wang et al. |
| 7,595,520 B2 | 9/2009 | Horng et al. |
| 7,598,579 B2 | 10/2009 | Horng et al. |
| 7,672,093 B2 | 3/2010 | Horng et al. |
| 9,065,039 B2 | 6/2015 | Park et al. |

(Continued)

FOREIGN PATENT DOCUMENTS

WO WO-2020008853 A1 * 1/2020 ........... H01L 27/222

*Primary Examiner* — Huan Hoang
(74) *Attorney, Agent, or Firm* — Harness, Dickey & Pierce, P.L.C.

(57) ABSTRACT

Disclosed is a magnetic memory device including a pinned magnetic pattern and a free magnetic pattern that are sequentially stacked on a substrate, a tunnel barrier pattern between the pinned magnetic pattern and the free magnetic pattern, a top electrode on the free magnetic pattern, and a capping pattern between the free magnetic pattern and the top electrode. The capping pattern includes a lower capping pattern, an upper capping pattern between the lower capping pattern and the top electrode, a first non-magnetic pattern between the lower capping pattern and the upper capping pattern, and a second non-magnetic pattern between the first non-magnetic pattern and the upper capping pattern. Each of the lower capping pattern and the upper capping pattern includes a non-magnetic metal. The first non-magnetic pattern and the second non-magnetic pattern include different metals from each other.

18 Claims, 11 Drawing Sheets

(56) References Cited

U.S. PATENT DOCUMENTS

| | | |
|---|---|---|
| 9,640,755 B2 | 5/2017 | Lee et al. |
| 9,991,313 B2 | 6/2018 | Watanabe et al. |
| 2018/0277746 A1* | 9/2018 | Abe .................... G11C 11/1659 |
| 2022/0165937 A1* | 5/2022 | Lille ...................... H10N 50/80 |

* cited by examiner

MAGNETIC MEMORY DEVICE

CROSS-REFERENCE TO RELATED APPLICATION

This U.S. nonprovisional application claims priority under 35 U.S.C § 119 to Korean Patent Application No. 10-2021-0068636 filed on May 27, 2021 in the Korean Intellectual Property Office, the disclosure of which is hereby incorporated by reference in its entirety.

BACKGROUND

The present inventive concepts relate to magnetic memory devices including a magnetic tunnel junction.

As electronic products trend toward high speed and/or low power consumption, high speed and low operating voltages are increasingly required for semiconductor memory devices incorporated in the electronic products. In order to meet the requirements above, magnetic memory devices have been developed as semiconductor memory devices. Because magnetic memory devices operate at high speeds and have nonvolatile characteristics, they have attracted considerable attention as the next-generation semiconductor memory devices.

In general, the magnetic memory device may include a magnetic tunnel junction (MTJ) pattern. The magnetic tunnel junction pattern includes two magnetic structures and an insulation layer interposed therebetween. The resistance of the magnetic tunnel junction pattern varies depending on magnetization directions of the two magnetic structures. For example, the magnetic tunnel junction pattern has high resistance when the magnetization directions of the two magnetic structures are anti-parallel and low resistance when the magnetization directions of the two magnetic structures are parallel. The magnetic memory device may write and read data using the resistance difference between the high and low resistances of the magnetic tunnel junction.

With the marked advance in electronic industry, there is an increasing demand for high integration and/or low power consumption of magnetic memory devices. Accordingly, many studies have been conducted to meet these demands.

SUMMARY

Some example embodiments of the present inventive concepts provide magnetic memory devices with improved electrical properties.

Some example embodiments of the present inventive concepts provide magnetic memory devices with improved magnetic properties.

According to some example embodiments of the present inventive concepts, a magnetic memory device may include a pinned magnetic pattern and a free magnetic pattern that are sequentially stacked on a substrate; a tunnel barrier pattern between the pinned magnetic pattern and the free magnetic pattern; a top electrode on the free magnetic pattern; and a capping pattern between the free magnetic pattern and the top electrode. The capping pattern may include: a lower capping pattern; an upper capping pattern between the lower capping pattern and the top electrode; a first non-magnetic pattern between the lower capping pattern and the upper capping pattern; and a second non-magnetic pattern between the first non-magnetic pattern and the upper capping pattern. Each of the lower capping pattern and the upper capping pattern may include a non-magnetic metal. The first non-magnetic pattern and the second non-magnetic pattern may include different metals from each other.

According to some example embodiments of the present inventive concepts, a magnetic memory device may include a top electrode on a substrate; a magnetic tunnel junction pattern between the substrate and the top electrode; a bottom electrode between the substrate and the magnetic tunnel junction pattern; and a protection layer on a lateral surface of the magnetic tunnel junction pattern. The magnetic tunnel junction pattern may include: a tunnel barrier pattern; a free magnetic pattern between the tunnel barrier pattern and the top electrode; and a capping pattern between the free magnetic pattern and the top electrode. The capping pattern may include: a first non-magnetic pattern; and a second non-magnetic pattern between the first non-magnetic pattern and the top electrode. The first non-magnetic pattern may include a first metal. The second non-magnetic pattern may include a second metal different from the first metal. The protection layer may include metal oxide that contains at least one selected from the first metal and the second metal.

DETAILED DESCRIPTION OF EMBODIMENTS

The following will now describe in detail some example embodiments of the present inventive concepts with reference to the accompanying drawings.

Figure 1:
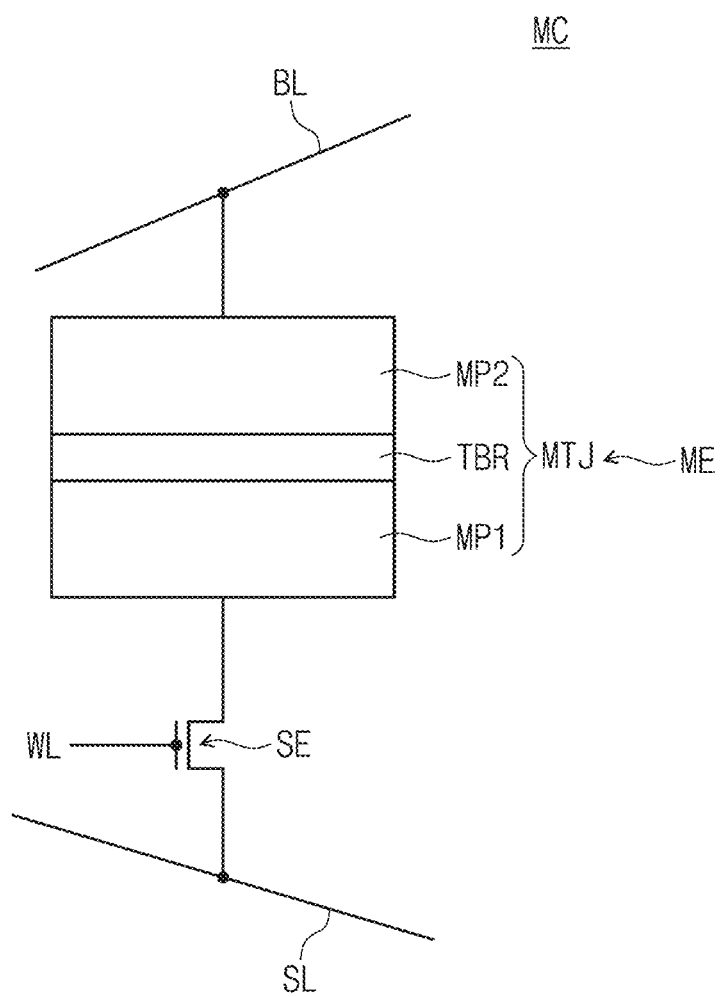
FIG. 1 illustrates a circuit diagram showing a unit memory cell of a magnetic memory device according to some example embodiments of the present inventive concepts.

FIG. 1 illustrates a circuit diagram showing a unit memory cell of a magnetic memory device according to some example embodiments of the present inventive concepts.

Referring to FIG. 1, a unit memory cell MC may include a memory element ME and a selection element SE. The memory element ME and the selection element SE may be electrically connected in series to each other. The memory element ME may be connected between a bit line BL and the selection element SE. The selection element SE may be connected between the memory element ME and a source line SL, and controlled by a word line WL. The selection element SE may include, for example, a bipolar transistor or a metal oxide semiconductor (MOS) field effect transistor.

The memory element ME may include a magnetic tunnel junction pattern MTJ, and the magnetic tunnel junction pattern MTJ may include a first magnetic pattern MP1, a second magnetic pattern MP2, and a tunnel barrier pattern TBR between the first and second magnetic patterns MP1 and MP2. One of the first and second magnetic patterns MP1 and MP2 may be a pinned magnetic pattern whose magnetization direction is fixed in a single direction regardless of an external magnetic field under ordinary use environment. The other of the first and second magnetic patterns MP1 and MP2 may be a free magnetic pattern whose magnetization direction is changed due to an external magnetic field between two stable magnetization directions. The magnetic tunnel junction pattern MTJ may have an electrical resistance whose value is much greater in case that the magnetization directions of the pinned and free magnetic patterns are anti-parallel to each other than in case that the magnetization directions of the pinned and free magnetic patterns are parallel to each other. For example, the electrical resistance of the magnetic tunnel junction pattern MTJ may be controlled by changing the magnetization direction of the free magnetic pattern. Therefore, the memory element ME may use the difference in electrical resistance dependent on the magnetization directions of the pinned and free magnetic patterns, which mechanism may cause the unit memory cell MC to store data therein.

Figure 2:
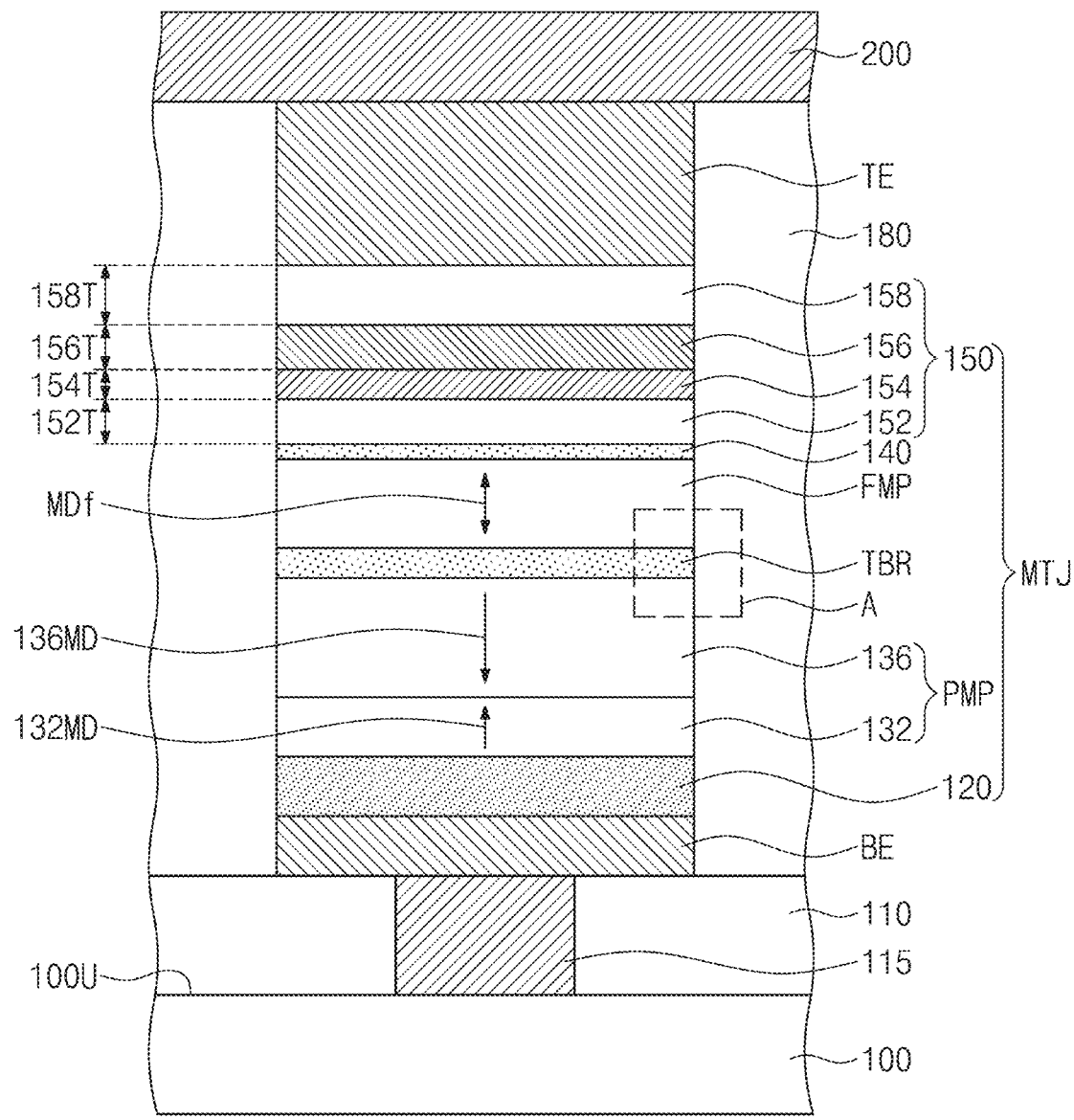
FIG. 2 illustrates a cross-sectional view showing a magnetic memory device according to some example embodiments of the present inventive concepts.
Figure 3:
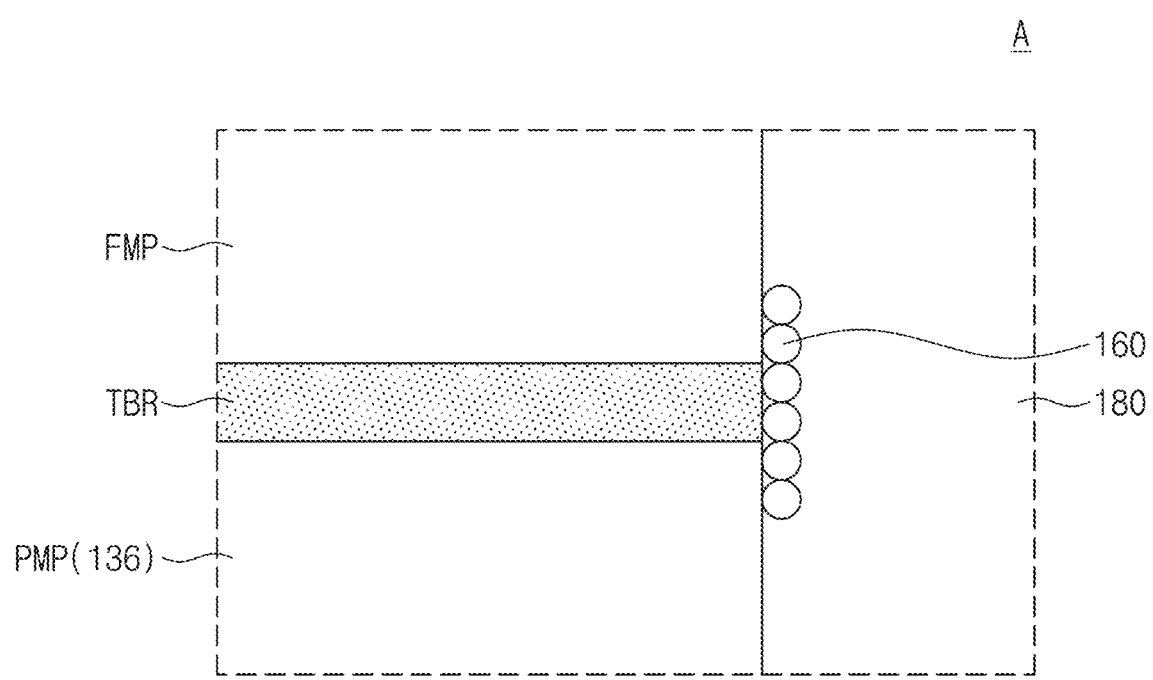
FIG. 3 illustrates an enlarged view showing section A of FIG. 2.

FIG. 2 illustrates a cross-sectional view showing a magnetic memory device according to some example embodiments of the present inventive concepts. FIG. 3 illustrates an enlarged view showing section A of FIG. 2.

Referring to FIG. 2, a first interlayer dielectric layer 110 may be disposed on a substrate 100, and a lower contact plug 115 may be disposed in the first interlayer dielectric layer 110. The substrate 100 may be a semiconductor substrate including silicon, silicon on insulator (SOI), silicon-germanium (SiGe), germanium (Ge), gallium-arsenic (GaAs), or the like. The first interlayer dielectric layer 110 may include, for example, one or more of oxide, nitride, and oxynitride.

The lower contact plug 115 may penetrate the first interlayer dielectric layer 110 and may electrically connect with the substrate 100. A selection element (see SE of FIG. 1) may be disposed in the substrate 100, and the selection element may be, for example, a field effect transistor. The lower contact plug 115 may be electrically coupled to one terminal of the selection element. The lower contact plug 115 may include one or more of doped semiconductor materials (e.g., doped silicon), metals (e.g., tungsten, titanium, and/or tantalum), metal-semiconductor compounds (e.g., metal silicide), and conductive metal nitride (e.g., titanium nitride, tantalum nitride, and/or tungsten nitride).

A bottom electrode BE, a magnetic tunnel junction pattern MTJ, and a top electrode TE may be sequentially stacked on the lower contact plug 115. The bottom electrode BE may be disposed between the lower contact plug 115 and the magnetic tunnel junction pattern MTJ, and the magnetic tunnel junction pattern MTJ may be disposed between the bottom electrode BE and the top electrode TE. The bottom electrode BE may be electrically connected to the lower contact plug 115. The bottom electrode BE may include, for example, conductive metal nitride (e.g., titanium nitride or tantalum nitride). The top electrode TE may include at least one selected from metal (e.g., Ta, W, Ru, or Ir) and conductive metal nitride (e.g., TiN).

The magnetic tunnel junction pattern MTJ may include a pinned magnetic pattern PMP, a free magnetic pattern FMP, and a tunnel barrier pattern TBR between the pinned magnetic pattern PMP and the free magnetic pattern FMP. The pinned magnetic pattern PMP may be disposed between the bottom electrode BE and the tunnel barrier pattern TBR, and the free magnetic pattern FMP may be disposed between the top electrode TE and the tunnel barrier pattern TBR. The magnetic tunnel junction pattern MTJ may further include a seed pattern 120 between the bottom electrode BE and the pinned magnetic pattern PMP, a capping pattern 150 between the top electrode TE and the free magnetic pattern FMP, and a first sub-pattern 140 between the capping pattern 150 and the free magnetic pattern FMP.

The seed pattern 120 may include a material which assists crystal growth of the pinned magnetic pattern PMP. The seed pattern 120 may include, for example, at least one selected from chromium (Cr), iridium (Ir), and ruthenium (Ru).

The pinned magnetic pattern PMP may include a first pinned pattern 132 between the seed pattern 120 and the tunnel barrier pattern TBR and a second pinned pattern 136 between the first pinned pattern 132 and the tunnel barrier pattern TBR. A magnetization direction 132MD of the first pinned pattern 132 and a magnetization direction 136MD of the second pinned pattern 136 may be perpendicular to an interface between the tunnel barrier pattern TBR and the free magnetic pattern FMP. The first pinned pattern 132 may include at least one selected from iron (Fe), cobalt (Co), and nickel (Ni). For example, the first pinned pattern 132 may include at least one selected from a perpendicular magnetic material (e.g., CoFeTb, CoFeGd, CoFeDy), a perpendicular magnetic material having an L10 structure, CoPt of a hexagonal close packed (HCP) lattice structure, and a perpendicular magnetic structure. The perpendicular magnetic material having the L10 structure may include at least one selected from FePt of the L10 structure, FePd of the L10 structure, CoPd of the L10 structure, and CoPt of the L10 structure. The perpendicular magnetic structure may include magnetic layers and non-magnetic layers that are alternately and repeatedly stacked. For example, the perpendicular magnetic structure may include at least one selected from (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where, n is the number of stacked layers). The second pinned pattern 136 may include a plurality of magnetic layers and a plurality of non-magnetic layers that are alternately stacked on the first pinned pattern 132. Each of the plurality of magnetic layers may include at least one selected from iron (Fe), cobalt (Co), and nickel (Ni), and each of the plurality of non-magnetic layers may include at least one selected from iridium (Ir) and ruthenium (Ru). At least one of the non-magnetic layers may antiferromagnetically couple the second pinned pattern 136 to the first pinned pattern 132. Therefore, the magnetization direction 136MD of the second pinned pattern 136 may be antiparallel to the magnetization direction 132MD of the first pinned pattern 132.

The tunnel barrier pattern TBR may include at least one selected from a magnesium (Mg) oxide layer, a titanium (Ti) oxide layer, an aluminum (Al) oxide layer, a magnesium-zinc (Mg—Zn) oxide layer, and a magnesium-boron (Mg—B) oxide layer.

A magnetization direction MDf of the free magnetic pattern FMP may be perpendicular to an interface between the tunnel barrier pattern TBR and the free magnetic pattern FMP. According to some example embodiments, the free magnetic pattern FMP may include a magnetic material with perpendicular magnetization characteristics induced at an interface between the free magnetic pattern FMP and the tunnel barrier pattern TBR. For example, the free magnetic pattern FMP may include cobalt-iron-boron (CoFeB). According to some example embodiments, the free magnetic pattern FMP may include at least one selected from a perpendicular magnetic material (e.g., CoFeTb, CoFeGd, CoFeDy), a perpendicular magnetic material having an L10 structure, CoPt of a hexagonal close packed (HCP) lattice structure, and a perpendicular magnetic structure. According to some example embodiments, at least one of the pinned magnetic pattern PMP and the free magnetic pattern FMP may include a Cobalt (Co) based Heusler alloy.

The first sub-pattern 140 may include a metal oxide layer. For example, the first sub-pattern 140 may include at least one selected from of a magnesium (Mg) oxide layer, a titanium (Ti) oxide layer, an aluminum (Al) oxide layer, a magnesium-zinc (Mg—Zn) oxide layer, and a magnesium-boron (Mg—B) oxide layer. For example, the first sub-pattern 140 may include a material the same as that of the tunnel barrier pattern TBR. The free magnetic pattern FMP may have magnetic anisotropy that is improved due to magnetic anisotropy induced at an interface between the first sub-pattern 140 and the free magnetic pattern FMP.

The capping pattern 150 may include a lower capping pattern 152 between the first sub-pattern 140 and the top electrode TE, an upper capping pattern 158 between the lower capping pattern 152 and the top electrode TE, a first non-magnetic pattern 154 between the lower capping pattern 152 and the upper capping pattern 158, and a second non-magnetic pattern 156 between the first non-magnetic pattern 154 and the upper capping pattern 158.

Each of the lower and upper capping patterns 152 and 158 may include a non-magnetic metal. For example, the lower capping pattern 152 may include ruthenium (Ru) or molybdenum (Mo), and the upper capping pattern 158 may include ruthenium (Ru).

The first and second non-magnetic patterns 154 and 156 may include different metals from each other. The first non-magnetic pattern 154 may include a first metal, and the second non-magnetic pattern 156 may include a second metal different from the first metal. The first and second metals may be non-magnetic metals. The non-magnetic metal of each of the lower and upper capping patterns 152 and 158 may be different from any of the first metal and the second metal.

Each of the first and second metals may have an oxidation potential greater than that of the non-magnetic metal of each of the lower and upper capping patterns 152 and 158. For example, each of the first and second metals may have an oxidation degree greater than that of the non-magnetic metal of each of the lower and upper capping patterns 152 and 158, and in this disclosure, the term "oxidation degree" may be defined to indicate the degree of bonding of metal with oxygen. Each of the first and second metals may be oxidized more easily than the non-magnetic metal of each of the lower and upper capping patterns 152 and 158. The second metal may have an oxidation potential greater than that of the first metal. For example, the second metal may have an oxidation degree greater than that of the first metal, and may be oxidized more easily than the first metal. The first metal may be, for example, tantalum (Ta). The second metal may be, for example, hafnium (Hf), zirconium (Zr), strontium (Sr), scandium (Sc), yttrium (Y), calcium (Ca), beryllium (Be), barium (Ba), or titanium (Ti).

The first non-magnetic pattern 154 may include the first metal or an alloy of the first metal. The alloy of the first metal may include an alloy of the first metal and boron (B). The first non-magnetic pattern 154 may include, for example, Ta or TaB. The second non-magnetic pattern 156 may include the second metal or an alloy of the second metal. The alloy of the second metal may include an ally of the second metal and boron (B), an alloy of the second metal and nitrogen (N), or an alloy of the second metal and silicon (Si). The second non-magnetic pattern 156 may include, for example, hafnium (Hf), zirconium (Zr), strontium (Sr), scandium (Sc), yttrium (Y), calcium (Ca), beryllium (Be), barium (Ba), titanium (Ti), or an alloy thereof combined with B, N, or Si.

Each of the lower capping pattern 152, the upper capping pattern 158, the first non-magnetic pattern 154, and the second non-magnetic pattern 156 may have a thickness in a first direction D1 perpendicular to a top surface 100U of the substrate 100. The lower capping pattern 152 may have a thickness 152T of equal to or greater than about 15 Å. When the thickness 152T of the lower capping pattern 152 is less than about 15 Å, magnetic anisotropy of the free magnetic pattern FMP may be deteriorated. The upper capping pattern 158 may have a thickness 158T of equal to or greater than about 20 Å. When the thickness 158T of the upper capping pattern 158 is less than about 20 Å, resistivity of the magnetic tunnel junction pattern MTJ may be increased due to influence of the first and second non-magnetic patterns 154 and 156. The second non-magnetic pattern 156 may have a thickness 156T greater than the thickness 154T of the first non-magnetic pattern 154. The thickness 156T of the second non-magnetic pattern 156 may range from about 10 Å to about 50 Å, and the thickness 154T of the first non-magnetic pattern 154 may range from about 5 Å to about 15 Å.

Referring to FIGS. 2 and 3, a protection layer 160 may be present on a lateral surface of the magnetic tunnel junction pattern MTJ. For example, the protection layer 160 may be present on a lateral surface of the tunnel barrier pattern TBR. The protection layer 160 may include metal oxide that contains at least one selected from the first metal of the first non-magnetic pattern 154 and the second metal of the second non-magnetic pattern 156.

During an etching process for forming the magnetic tunnel junction pattern MTJ, conductive etch byproducts may be generated from the top electrode TE and may be re-deposited on the lateral surface of the magnetic tunnel junction pattern MTJ (e.g., the lateral surface of the tunnel barrier pattern TBR). In this case, an electrical short may be induced between magnetic patterns (e.g., the pinned magnetic pattern PMP and the free magnetic pattern FMP) included in the magnetic tunnel junction pattern MTJ.

According to the some example embodiments, the capping pattern 150 may include the first non-magnetic pattern 154 and the second non-magnetic pattern 156 that are interposed between the lower capping pattern 152 and the upper capping pattern 158. The first non-magnetic pattern 154 and the second non-magnetic pattern 156 may respectively include the first metal and the second metal, each of which first and second metals may have an oxidation potential greater than that of the non-magnetic metal included in each of the lower capping pattern 152 and the upper capping pattern 158. During an etching process for forming the magnetic tunnel junction pattern MTJ, etch byproducts may be generated from the first and second non-magnetic patterns 154 and 156, and the etch byproducts may include at least one selected from the first metal and the second metal. The etch byproducts may be re-deposited on the lateral surface of the magnetic tunnel junction pattern MTJ (e.g., the lateral surface of the tunnel barrier pattern TBR), and accordingly the protection layer 160 may be formed on the lateral surface of the magnetic tunnel junction pattern MTJ (e.g., the lateral surface of the tunnel barrier pattern TBR). As the first metal and the second metal have relatively high oxidation potentials, the protection layer 160 may include metal oxide that contains at least one selected from the first metal and the second metal. As the protection layer 160 including the metal oxide is formed on the lateral surface of the magnetic tunnel junction pattern MTJ (e.g., the lateral surface of the tunnel barrier pattern TBR), an electrical short may be suppressed between magnetic patterns (e.g., the pinned magnetic pattern PMP and the free magnetic pattern FMP) included in the magnetic tunnel junction pattern MTJ.

In addition, the first non-magnetic pattern 154 may be adjacent to the lower capping pattern 152, and the first metal of the first non-magnetic pattern 154 may have an oxidation potential less than that of the second metal included in the second non-magnetic pattern 156. The first non-magnetic pattern 154 may serve as a buffer between the lower capping pattern 152 and the second non-magnetic pattern 156 having relatively high oxidation potentials, and therefore magnetic properties of the magnetic tunnel junction pattern MTJ may be prevented from being deteriorated or have reduced deterioration due to influence of the second non-magnetic pattern 156.

Accordingly, it may be possible to provide a magnetic memory device with improved electrical and magnetic properties.

Referring back to FIG. 2, the first interlayer dielectric layer 110 may be provided thereon with a second interlayer dielectric layer 180 that covers a lateral surface of the bottom electrode BE, a lateral surface of the magnetic tunnel junction pattern MTJ, and a lateral surface of the top electrode TE. The second interlayer dielectric layer 180 may include, for example, one or more of oxide, nitride, and oxynitride.

The second interlayer dielectric layer 180 may be provided thereon with an upper line 200 connected to the top electrode TE. The upper line 200 may be connected through the top electrode TE to the magnetic tunnel junction pattern MTJ, and may serve as the bit line BL of FIG. 1. The upper line 200 may include at least one selected from metal (e.g., copper) and conductive metal nitride.

Figure 4:
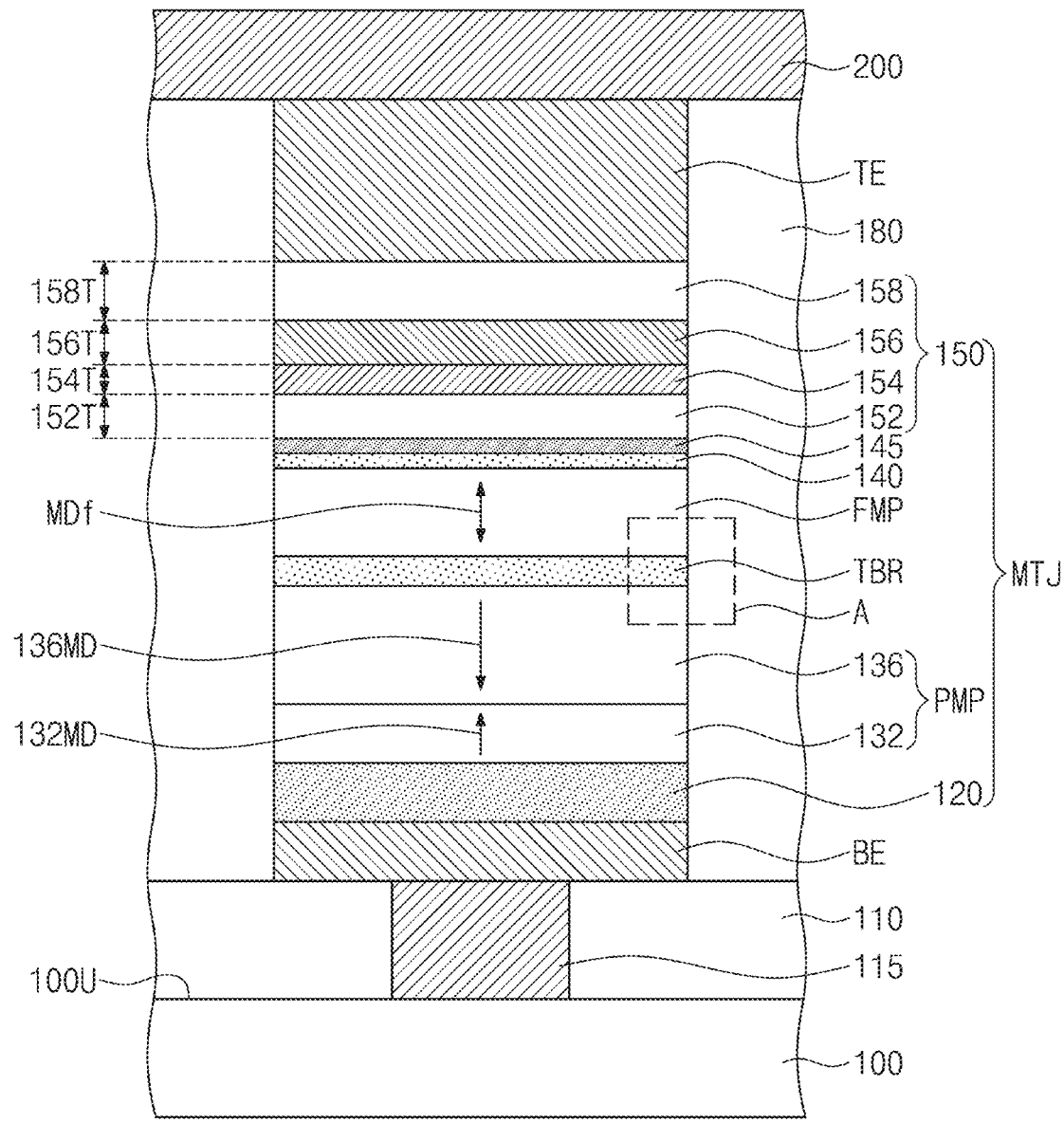
FIG. 4 illustrates a cross-sectional view showing a magnetic memory device according to some example embodiments of the present inventive concepts.

FIG. 4 illustrates a cross-sectional view showing a magnetic memory device according to some example embodiments of the present inventive concepts. The following magnetic memory device is similar to that discussed with reference to FIGS. 2 and 3, and thus the major differences between the magnetic memory devices will be described below in the interest of brevity of description.

Referring to FIG. 4, the magnetic tunnel junction pattern MTJ may further include a second sub-pattern 145 between the capping pattern 150 and the first sub-pattern 140. The second sub-pattern 145 may be interposed between the lower capping pattern 152 and the first sub-pattern 140. The second sub-pattern 145 may include a non-magnetic metal. The non-magnetic metal of the second sub-pattern 145 may be different from that of the lower capping pattern 152. The second sub-pattern 145 may include a metal element the same as that of the first sub-pattern 140. For example, the second sub-pattern 145 may include magnesium (Mg), and the first sub-pattern 140 may include a magnesium (Mg) oxide layer. The second sub-pattern 145 may be provided to prevent or reduce a reduction in perpendicular magnetization of the free magnetic pattern FMP.

Except the differences discussed above, the magnetic memory device of FIG. 4 according to some example embodiments is substantially the same as the magnetic memory device discussed with reference to FIGS. 2 and 3.

Figure 5:
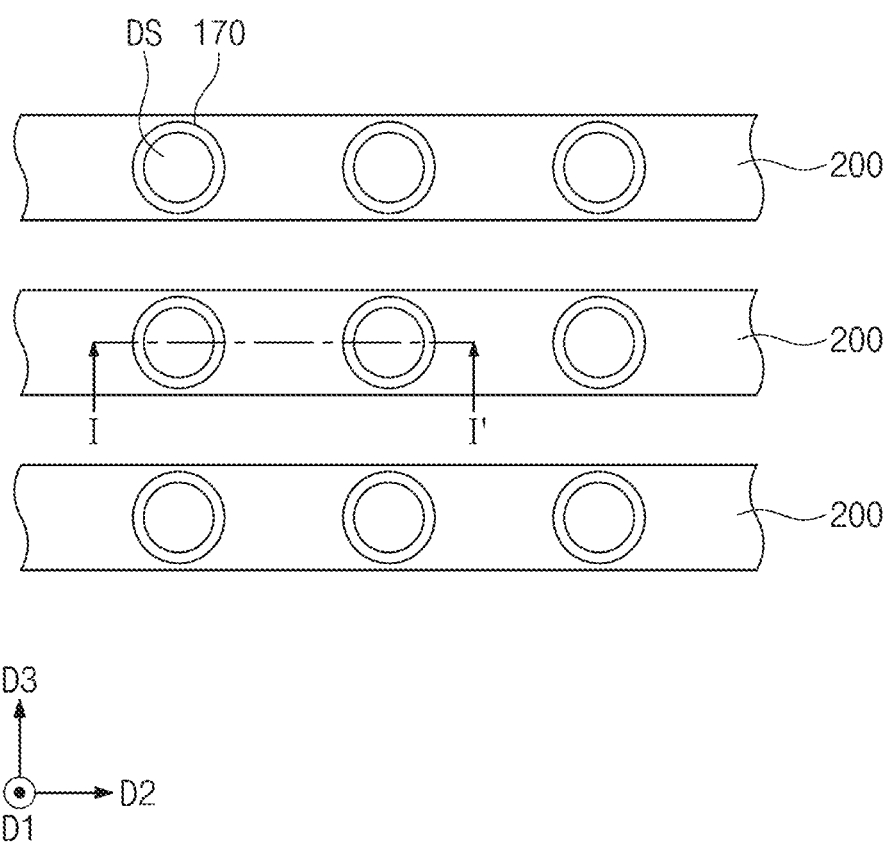
FIG. 5 illustrates a plan view showing a magnetic memory device according to some example embodiments of the present inventive concepts.
Figure 6:
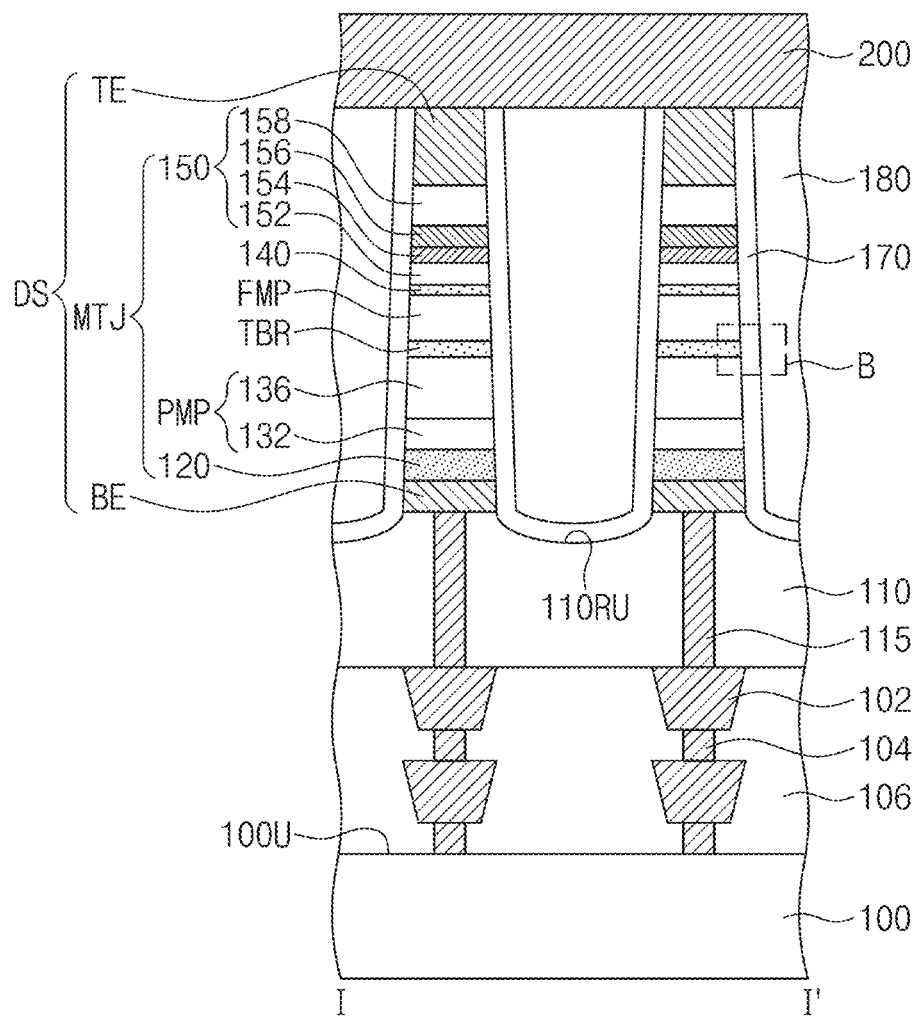
FIG. 6 illustrates a cross-sectional view taken along line I-I' of FIG. 5.
Figure 7:
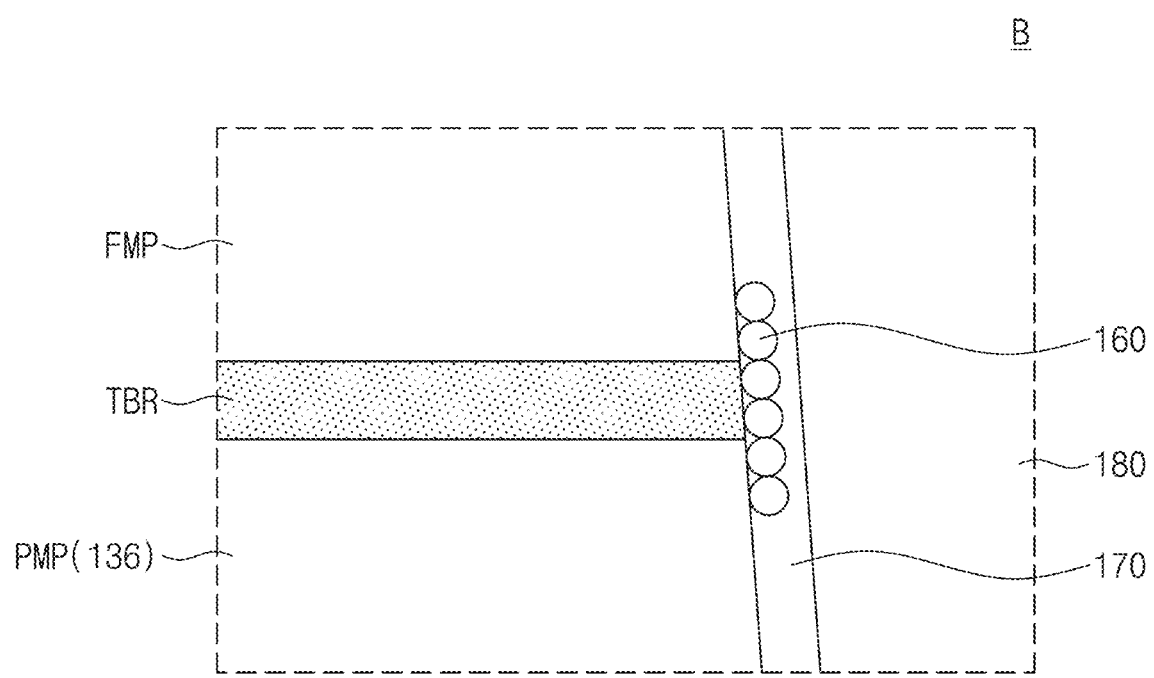
FIG. 7 illustrates an enlarged view showing section B of FIG. 6.

FIG. 5 illustrates a plan view showing a magnetic memory device according to some example embodiments of the present inventive concepts. FIG. 6 illustrates a cross-sectional view taken along line I-I' of FIG. 5. FIG. 7 illustrates an enlarged view showing section B of FIG. 6. The following magnetic memory device is similar to that discussed with reference to FIGS. 2 and 4, and thus the major differences between the magnetic memory devices will be described below in the interest of brevity of description.

Referring to FIGS. 5 and 6, lower lines 102 and lower contacts 104 may be disposed on a substrate 100. The lower lines 102 may be spaced apart from a top surface 100U of the substrate 100 along a first direction D1 perpendicular to the top surface 100U of the substrate 100. The lower contacts 104 may be disposed between the substrate 100 and the lower lines 102, and each of the lower lines 102 may be electrically connected to the substrate 100 through a corresponding one of the lower contacts 104. The lower lines 102 and the lower contacts 104 may include metal, such as copper (Cu).

The substrate 100 may have selection elements (see SE of FIG. 1) disposed therein. The selection elements may be, for example, field effect transistors. Each of the lower lines 102 may be electrically connected through a corresponding lower contact 104 to one terminal of a corresponding one of the selection elements.

The substrate 100 may be provided thereon with a lower interlayer dielectric layer 106 that covers the lower lines 102 and the lower contacts 104. Uppermost ones of the lower lines 102 may have their top surfaces coplanar with that of the lower interlayer dielectric layer 106. The top surfaces of the uppermost lower lines 102 may be located at substantially the same height as that of the top surface of the lower interlayer dielectric layer 106. In this disclosure, the term "height" may mean a distance measured along the first direction D1 from the top surface 100U of the substrate 100. The lower interlayer dielectric layer 106 may include, for example, one or more of oxide, nitride, and oxynitride.

The lower interlayer dielectric layer 106 may be provided thereon with a first interlayer dielectric layer 110 that covers the top surfaces of the uppermost lower lines 102.

A plurality of lower contact plugs 115 may be disposed in the first interlayer dielectric layer 110. The plurality of lower contact plugs 115 may be spaced apart from each other along a second direction D2 and a third direction D3 that are parallel to the top surface 100U of the substrate 100. The second direction D2 and the third direction D3 may intersect each other. Each of the plurality of lower contact plugs 115 may penetrate the first interlayer dielectric layer 110 and may connect with a corresponding one of the lower lines 102. Each of the lower contact plugs 115 may be electrically connected through the corresponding lower line 102 to one terminal of a corresponding one of the selection elements.

The first interlayer dielectric layer 110 may be provided thereon with a plurality of data storage patterns DS that are spaced apart from each other in the second direction D2 and the third direction D3. The plurality of data storage patterns DS may be correspondingly disposed on and connected to the plurality of lower contact plugs 115.

Each of the plurality of data storage patterns DS may include a bottom electrode BE, a magnetic tunnel junction pattern MTJ, and a top electrode TE that are sequentially stacked on a corresponding lower contact plug 115. The bottom electrode BE may be disposed between the corresponding lower contact plug 115 and the magnetic tunnel junction pattern MTJ, and the magnetic tunnel junction pattern MTJ may be disposed between the bottom electrode BE and the top electrode TE. The magnetic tunnel junction pattern MTJ may be configured identically to the magnetic tunnel junction pattern MTJ discussed with reference to FIGS. 2 to 4. According to some example embodiments, as discussed with reference to FIG. 2, the magnetic tunnel junction pattern MTJ may include a pinned magnetic pattern PMP, a free magnetic pattern FMP, and a tunnel barrier pattern TBR between the pinned magnetic pattern PMP and the free magnetic pattern FMP. The pinned magnetic pattern PMP may be disposed between the bottom electrode BE and the tunnel barrier pattern TBR, and the free magnetic pattern FMP may be disposed between the top electrode TE and the tunnel barrier pattern TBR. The magnetic tunnel junction pattern MTJ may further include a seed pattern 120 between the bottom electrode BE and the pinned magnetic pattern PMP, a capping pattern 150 between the top electrode TE and the free magnetic pattern FMP, and a first sub-pattern 140 between the capping pattern 150 and the free magnetic pattern FMP. The pinned magnetic pattern PMP may include a first pinned pattern 132 between the seed pattern 120 and the tunnel barrier pattern TBR and a second pinned pattern 136 between the first pinned pattern 132 and the tunnel barrier pattern TBR. The capping pattern 150 may include a lower capping pattern 152 between the first sub-pattern 140 and the top electrode TE, an upper capping pattern 158 between the lower capping pattern 152 and the top electrode TE, a first non-magnetic pattern 154 between the lower capping pattern 152 and the upper capping pattern 158, and a second non-magnetic pattern 156 between the first non-magnetic pattern 154 and the upper capping pattern 158. In some example embodiments, as discussed with reference to FIG. 4, the magnetic tunnel junction pattern MTJ may further include a second sub-pattern 145 between the capping pattern 150 and the first sub-pattern 140.

Referring to FIGS. 6 and 7, a protection layer 160 may be present on a lateral surface of the magnetic tunnel junction pattern MTJ. For example, the protection layer 160 may be present on a lateral surface of the tunnel barrier pattern TBR. The protection layer 160 may be substantially the same as the protection layer 160 discussed with reference to FIGS. 2 and 3. The protection layer 160 may include metal oxide that contains at least one selected from a first metal of the first non-magnetic pattern 154 and a second metal of the second non-magnetic pattern 156.

According to some example embodiments, the first interlayer dielectric layer 110 may have a top surface 110RU that is recessed toward the substrate 100 between the plurality of data storage patterns DS. A protective dielectric layer 170 may surround a lateral surface of each of the plurality of data storage patterns DS. The protective dielectric layer 170 may cover a lateral surface of the bottom electrode BE, a lateral surface of the magnetic tunnel junction pattern MTJ, and a lateral surface of the top electrode TE, and when viewed in plan, the protective dielectric layer 170 may surround the lateral surfaces of the bottom electrode BE, the magnetic tunnel junction pattern MTJ, and the top electrode TE. The protective dielectric layer 170 may cover the protection layer 160 on the lateral surface of the magnetic tunnel junction pattern MTJ (e.g., the lateral surface of the tunnel barrier pattern TBR). The protective dielectric layer 170 may extend from a lateral surface of each of the plurality of data storage patterns DS toward the recessed top surface 110RU of the first interlayer dielectric layer 110. The protective dielectric layer 170 may conformally cover the recessed top surface 110RU of the first interlayer dielectric layer 110. The protective dielectric layer 170 may include nitride (e.g., silicon nitride). The protective dialectric layer may be tapered inwards at increasing heights in D1 (e.g., further from the substrate 100), or be parallel to the first direction D1. That is, in some example embodiments, the width of the data storage pattern DS may decrease along the first direction D1, or the width of the data storage pattern DS may be maintained along the first direction D1.

Referring back to FIGS. 5 and 6, the first interlayer dielectric layer 110 may be provided thereon with a second interlayer dielectric layer 180 that covers the plurality of data storage patterns DS. The protective dielectric layer 170 may be interposed between the second interlayer dielectric layer 180 and a lateral surface of each of the plurality of data storage patterns DS, and may extend between the second interlayer dielectric layer 180 and the recessed top surface 110RU of the first interlayer dielectric layer 110. That is, the protective dielectric layer 170 may be conformal along the recessed top surface 100RU between data storage patterns DS, and the bottom surface of the second interlayer dielectric layer 180 may be conformal to the protective dielectric layer 170.

A plurality of upper lines 200 may be disposed on the second interlayer dielectric layer 180. The plurality of upper lines 200 may extend in the second direction D2 and may be spaced apart from each other in the third direction D3. Each of the plurality of upper lines 200 may be connected to the data storage patterns DS that are spaced apart from each other in the second direction D2.

Figure 8:
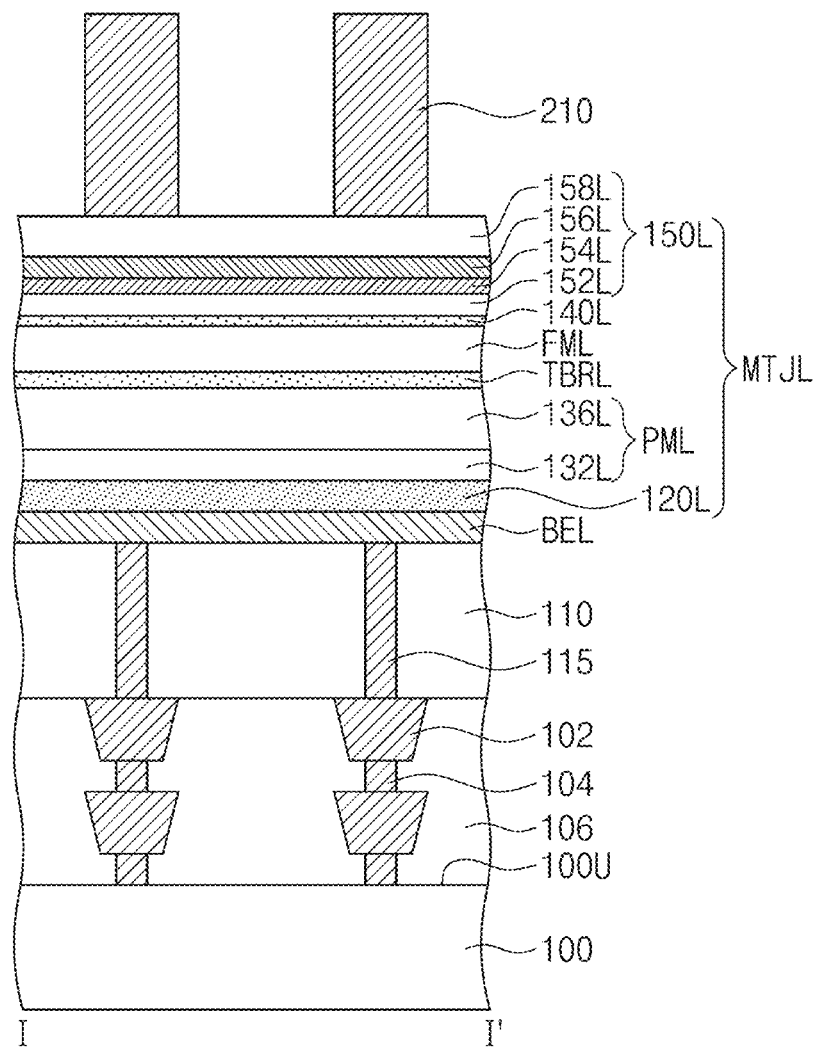
FIGS. 8, 9, and 11 illustrate cross-sectional views taken along line I-I' of FIG. 5, showing a method of fabricating a magnetic memory device according to some example embodiments of the present inventive concepts.
Figure 9:
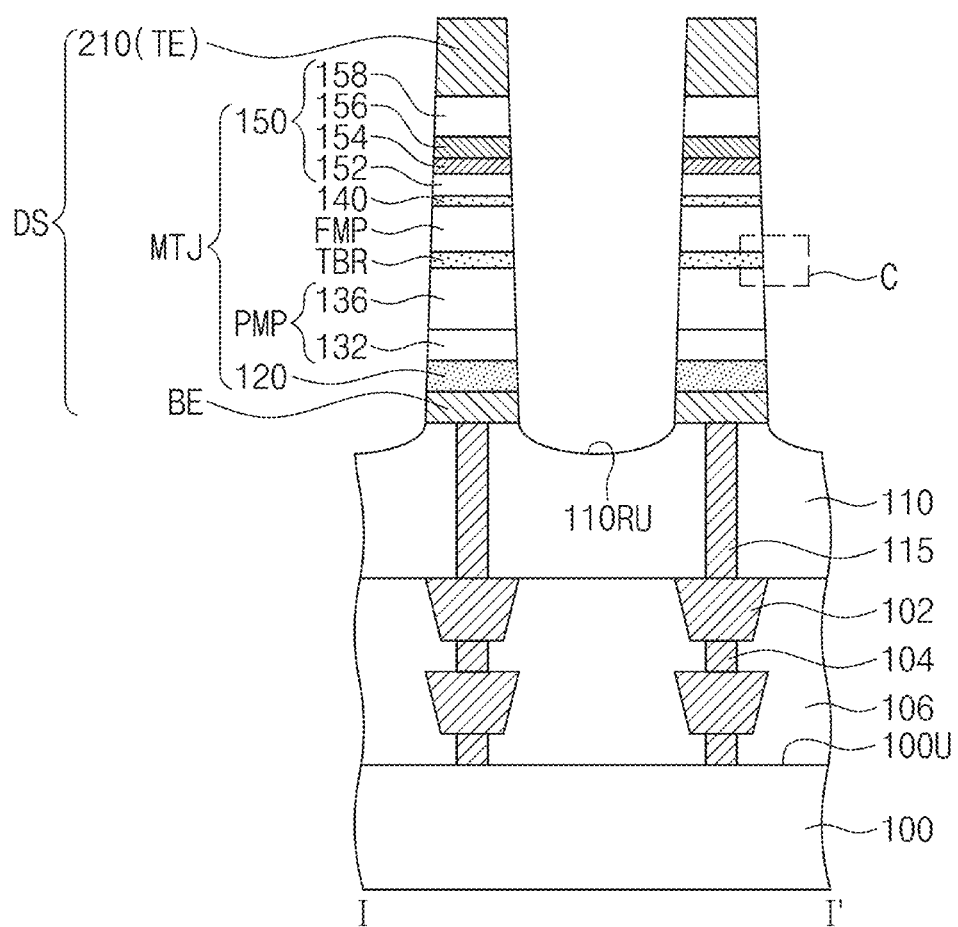
Figure 10:
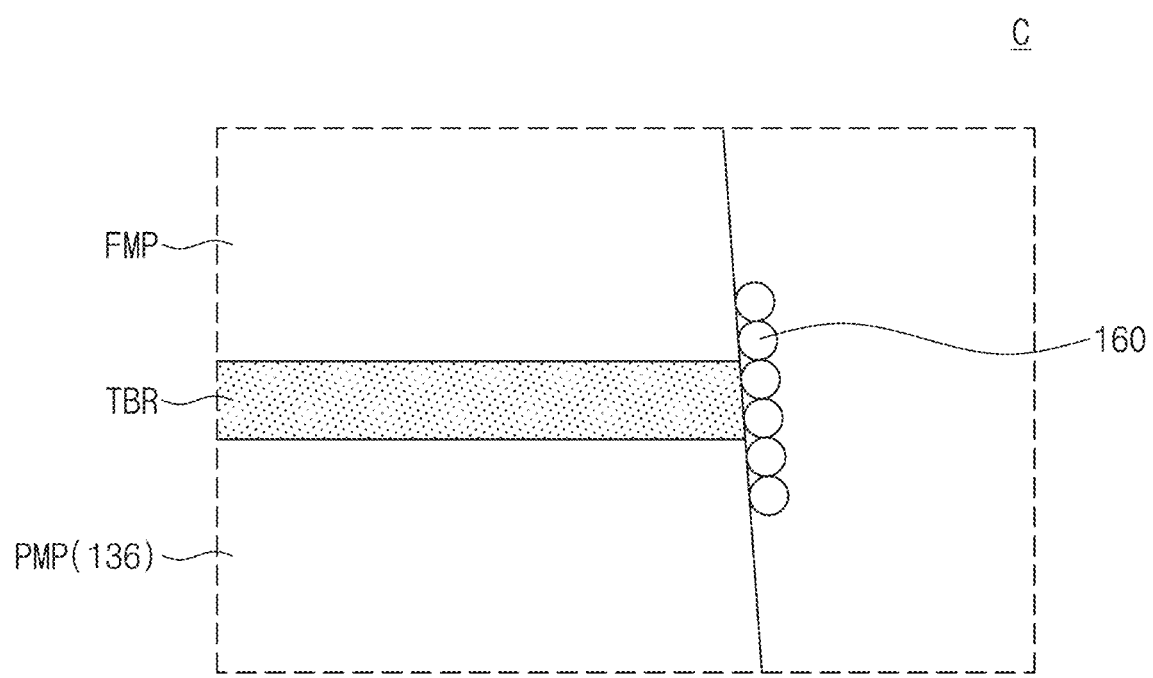
FIG. 10 illustrates an enlarged view showing section C of FIG. 9.
Figure 11:
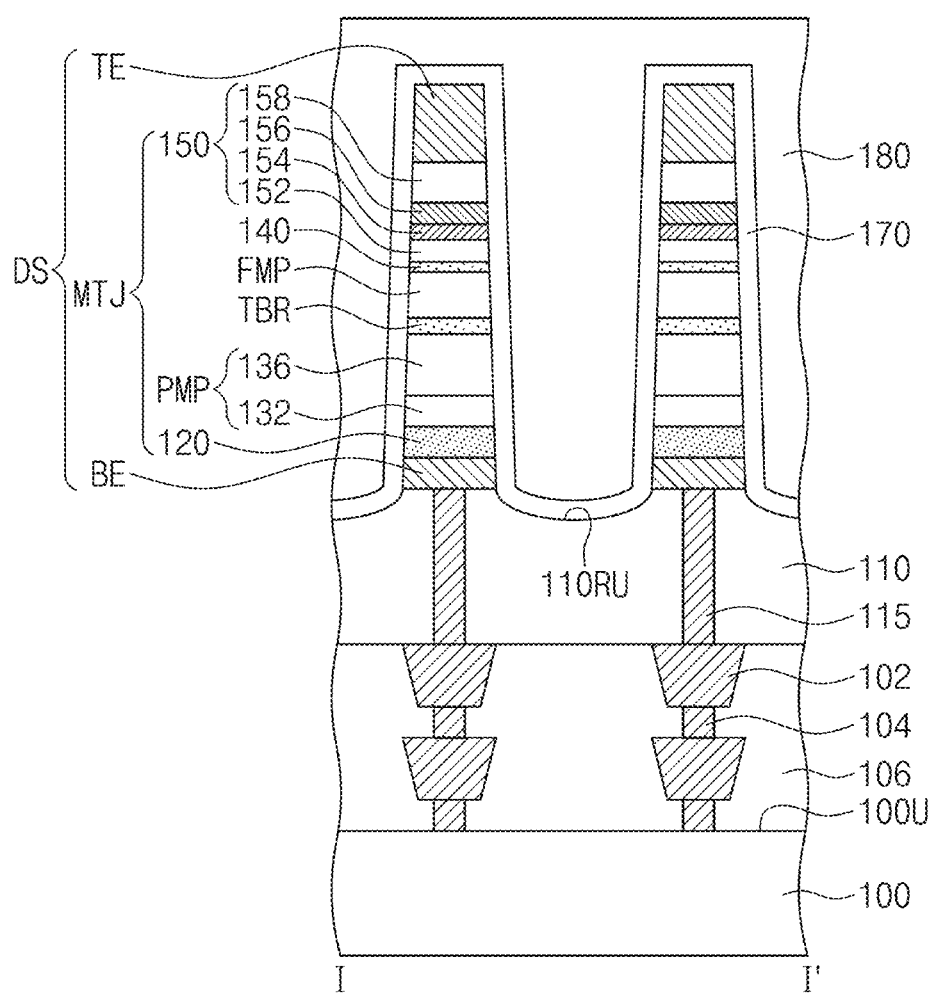

FIGS. 8, 9, and 11 illustrate cross-sectional views taken along line I-I' of FIG. 5, showing a method of fabricating a magnetic memory device according to some example embodiments of the present inventive concepts. FIG. 10 illustrates an enlarged view showing section C of FIG. 9. The following magnetic memory device is similar to that discussed with reference to FIGS. 2 and 7, and thus the major differences between the magnetic memory devices will be described below in the interest of brevity of description.

Referring to FIG. 8, selection elements (see SE of FIG. 1) may be formed in a substrate 100, and lower lines 102 and lower contacts 104 may be formed on the substrate 100. Each of the lower lines 102 may be electrically connected through a corresponding one of the lower contacts 104 to one terminal of a corresponding one of the selection elements. A lower interlayer dielectric layer 106 may be formed on the substrate 100 to cover the lower lines 102 and the lower contacts 104. Uppermost ones of the lower lines 102 may have their top surfaces coplanar with that of the lower interlayer dielectric layer 106.

A first interlayer dielectric layer 110 may be formed on the lower interlayer dielectric layer 106, and a plurality of lower contact plugs 115 may be formed in the first interlayer dielectric layer 110. Each of the plurality of lower contact plugs 115 may penetrate the first interlayer dielectric layer 110 and may connect with a corresponding one of the lower lines 102. The formation of the plurality of lower contact plugs 115 may include, for example, forming lower contact holes that penetrate the first interlayer dielectric layer 110, forming on the first interlayer dielectric layer 110 a lower contact layer that fills the lower contact holes, and planarizing the lower contact layer until a top surface of the first interlayer dielectric layer 110 is exposed.

A bottom electrode layer BEL and a magnetic tunnel junction layer MTJL may be sequentially formed on the first interlayer dielectric layer 110. According to some example embodiments, the magnetic tunnel junction layer MTJL may include a seed layer 120L, a pinned magnetic layer PML, a tunnel barrier layer TBRL, a free magnetic layer FML, a first sub-layer 140L, and a capping layer 150L that are sequentially stacked on the bottom electrode layer BEL. The pinned magnetic layer PML may include a first pinned layer 132L and a second pinned layer 136L that are sequentially stacked on the seed layer 120L. The capping layer 150L may include a lower capping layer 152L, a first non-magnetic layer 154L, a second non-magnetic layer 156L, and an upper capping layer 158L that are sequentially stacked on the first sub-layer 140L. The bottom electrode layer BEL and the magnetic tunnel junction layer MTJL may be formed by, for example, sputtering, chemical vapor deposition, atomic layer deposition, or the like.

A plurality of conductive mask patterns 210 may be formed on the magnetic tunnel junction layer MTJL. The conductive mask patterns 210 may define regions on which magnetic tunnel junction patterns will be formed as discussed below. The conductive mask patterns 210 may include at least one selected from metal (e.g., Ta, W, Ru, or Ir) and conductive metal nitride (e.g., TiN).

Referring to FIGS. 9 and 10, the conductive mask patterns 210 may be used as an etching mask to sequentially etch the magnetic tunnel junction layer MTJL and the bottom electrode layer BEL. Therefore, a magnetic tunnel junction pattern MTJ and a bottom electrode BE may be formed on the first interlayer dielectric layer 110. The bottom electrode BE may be connected to a corresponding lower contact plug 115, and the magnetic tunnel junction pattern MTJ may be formed on the bottom electrode BE.

The etching of the magnetic tunnel junction layer MTJL may include using the conductive mask patterns 210 as an etching mask to sequentially etch the capping layer 150L, the first sub-layer 140L, the free magnetic layer FML, the tunnel barrier layer TBRL, the pinned magnetic layer PML, and the seed layer 120L. Accordingly, the magnetic tunnel junction pattern MTJ may include a seed pattern 120, a pinned magnetic pattern PMP, a tunnel barrier pattern TBR, a free magnetic pattern FMP, a first sub-pattern 140, and a capping pattern 150 that are sequentially stacked on a bottom electrode BE. The pinned magnetic pattern PMP may include a first pinned pattern 132 and a second pinned pattern 136 that are formed by etching the first pinned layer 132L and the second pinned layer 136L. The capping pattern 150 may include a lower capping pattern 152, a first non-magnetic pattern 154, a second non-magnetic pattern 156, and an upper capping pattern 158 that are formed by etching the lower capping layer 152L, the first non-magnetic layer 154L, the second non-magnetic layer 156L, and the upper capping layer 158L.

An etching process for etching the magnetic tunnel junction layer MTJL and the bottom electrode layer BEL may be, for example, an ion beam etching process that uses an ion beam. The ion beam may include inert ions. During the ion beam etching process, etch byproducts generated from the first and second non-magnetic patterns 154 and 156 may be re-deposited on a lateral surface of the magnetic tunnel junction pattern MTJ (e.g., lateral surface of the tunnel barrier pattern TBR), and therefore a protection layer 160 may be formed on the lateral surface of the magnetic tunnel junction pattern MTJ (e.g., the lateral surface of the tunnel barrier pattern TBR).

The first non-magnetic pattern 154 and the second non-magnetic pattern 156 may respectively include a first metal and a second metal, each of which first and second metals may have an oxidation potential greater than that of a non-magnetic metal included in each of the lower capping pattern 152 and the upper capping pattern 158. The etch byproducts generated from the first and second non-magnetic patterns 154 and 156 may include at least one selected from the first metal and the second metal. As the first metal and the second metal have relatively high oxidation potentials, the protection layer 160 formed by re-deposition of the etch byproducts may include metal oxide that contains at least one selected from the first metal and the second metal. For example, the etch byproducts may be oxidized while being re-deposited on the lateral surface of the magnetic tunnel junction pattern MTJ (e.g., the lateral surface of the tunnel barrier pattern TBR), as a result, the protection layer 160 may be formed. For another example, the formation of the protection layer 160 may include performing an additional oxidation process for oxidizing the etch byproducts simultaneously with or after the ion beam etching process. In some example embodiments, the protection layer 160 is a continuous layer along the lateral surface of the tunnel barrier pattern TBR, and at least a portion of the pinned magnetic pattern PMP and the free magnetic pattern FMP The ion beam etching process may recess a top surface of the first interlayer dielectric layer 110 on opposite sides of the magnetic tunnel junction pattern MTJ. Therefore, the first interlayer dielectric layer 110 may have a recessed top surface 110RU on opposite sides of the magnetic tunnel junction pattern MTJ (e.g., on each side of the magnetic tunnel junction pattern MTJ).

After the ion beam etching process, remainder of each of the conductive mask patterns 210 may remain on the magnetic tunnel junction pattern MTJ. The remainder of each of the conductive mask patterns 210 may serve as a top electrode TE. In some example embodiments, the remainder of each of the conductive mask patterns 210 may be called the top electrode TE. The top electrode TE, the magnetic tunnel junction pattern MTJ, and the bottom electrode BE may constitute a data storage pattern DS.

Referring to FIG. 11, a protective dielectric layer 170 may be formed on the first interlayer dielectric layer 110 to cover the data storage pattern DS. The protective dielectric layer 170 may be formed to conformally cover top and lateral surfaces of the data storage pattern DS and to extend along the recessed top surface 110RU of the first interlayer dielectric layer 110. The protective dielectric layer 170 may cover the protection layer 160 on the lateral surface of the magnetic tunnel junction pattern MTJ. A second interlayer dielectric layer 180 may be formed on the protective dielectric layer 170 to cover the data storage pattern DS.

Referring back to FIG. 6, the second interlayer dielectric layer 180 and the protective dielectric layer 170 may be partially removed to expose a top surface of the top electrode TE included in the data storage pattern DS. An upper line 200 may be formed on the second interlayer dielectric layer 180 to cover the exposed top surface of the top electrode TE. The upper line 200 may be electrically connected to the top electrode TE.

According to the some example embodiments, the capping pattern 150 may include the first non-magnetic pattern 154 and the second non-magnetic pattern 156 that are interposed between the lower capping pattern 152 and the upper capping pattern 158. The first non-magnetic pattern 154 and the second non-magnetic pattern 156 may respectively include a first metal and a second metal, which first and second metals may have relatively high oxidation potentials. During an etching process for forming the magnetic tunnel junction pattern MTJ, etch byproducts generated from the first and second non-magnetic patterns 154 and 156 may be re-deposited on the lateral surface of the magnetic tunnel junction pattern MTJ (e.g., the lateral surface of the tunnel barrier pattern TBR), and accordingly the protection layer 160 may be formed on the lateral surface of the magnetic tunnel junction pattern MTJ (e.g., the lateral surface of the tunnel barrier pattern TBR). As the first metal and the second metal have relatively high oxidation potentials, the protection layer 160 may include metal oxide that contains at least one selected from the first metal and the second metal. As the protection layer 160 including the metal oxide is formed on the lateral surface of the magnetic tunnel junction pattern MTJ (e.g., the lateral surface of the tunnel barrier pattern TBR), an electrical short may be suppressed between magnetic patterns (e.g., the pinned magnetic pattern PMP and the free magnetic pattern FMP) included in the magnetic tunnel junction pattern MTJ.

In addition, the first metal of the first non-magnetic pattern 154 may have an oxidation potential less than that of the second metal included in the second non-magnetic pattern 156. The first non-magnetic pattern 154 may serve as a buffer between the lower capping pattern 152 and the second non-magnetic pattern 156 having relatively high oxidation potentials, and therefore magnetic properties of the magnetic tunnel junction pattern MTJ may be prevented from being deteriorated or reduce deterioration due to influence of the second non-magnetic pattern 156.

Accordingly, it may be possible to provide a magnetic memory device with improved electrical and magnetic properties.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The aforementioned description provides some example embodiments for explaining the present inventive concepts. Therefore, the present inventive concepts are not limited to the example embodiments described above, and it will be understood by one of ordinary skill in the art that variations in form and detail may be made therein without departing from the spirit and essential features of the present inventive concepts.

What is claimed is:

1. A magnetic memory device, comprising:
   a pinned magnetic pattern and a free magnetic pattern that are sequentially stacked on a substrate;
   a tunnel barrier pattern between the pinned magnetic pattern and the free magnetic pattern;
   a top electrode on the free magnetic pattern; and
   a capping pattern between the free magnetic pattern and the top electrode,
   wherein the capping pattern includes:
      a lower capping pattern;
      an upper capping pattern between the lower capping pattern and the top electrode;
      a first non-magnetic pattern between the lower capping pattern and the upper capping pattern; and
      a second non-magnetic pattern between the first non-magnetic pattern and the upper capping pattern,
   each of the lower capping pattern and the upper capping pattern including a non-magnetic metal, and
   the first non-magnetic pattern and the second non-magnetic pattern including different metals from each other, and
   wherein the first non-magnetic pattern includes a first metal, the second non-magnetic pattern includes a second metal different from the first metal, and each of the first metal and the second metal has an oxidation potential greater than an oxidation potential of the non-magnetic metal included in each of the lower capping pattern and the upper capping pattern.

2. The magnetic memory device of claim 1, wherein an oxidation potential of the second metal is greater than an oxidation potential of the first metal.

3. The magnetic memory device of claim 2, wherein the first metal and the second metal are non-magnetic metals, and the non-magnetic metal of each of the lower capping pattern and the upper capping pattern is different from the first metal and the second metal.

4. The magnetic memory device of claim 1, wherein the first non-magnetic pattern includes a first metal or an alloy of the first metal, and the first metal is Ta.

5. The magnetic memory device of claim 4, wherein the alloy of the first metal includes an alloy of the first metal and boron (B).

6. The magnetic memory device of claim 4, wherein the second non-magnetic pattern includes a second metal or an alloy of the second metal, and the second metal is Hf, Zr, Sr, Sc, Y, Ca, Be, Ba, or Ti.

7. The magnetic memory device of claim 6, wherein the alloy of the second metal includes an alloy of the second metal and boron (B), an alloy of the second metal and nitrogen (N), or an alloy of the second metal and silicon (Si).

8. The magnetic memory device of claim 1, wherein each of the first non-magnetic pattern and the second non-magnetic pattern has a thickness in a direction perpendicular to a top surface of the substrate, and the thickness of the second non-magnetic pattern is greater than the thickness of the first non-magnetic pattern.

9. The magnetic memory device of claim 1, further comprising a first sub-pattern between the free magnetic pattern and the capping pattern,
   wherein the first sub-pattern is between the free magnetic pattern and the lower capping pattern and includes a metal oxide layer.

10. The magnetic memory device of claim 9, further comprising a second sub-pattern between the first sub-pattern and the lower capping pattern,
    wherein the second sub-pattern includes a non-magnetic metal, and
    wherein the non-magnetic metal of the second sub-pattern is different from the non-magnetic metal of the lower capping pattern.

11. The magnetic memory device of claim 1, further comprising a protection layer on a lateral surface of the tunnel barrier pattern,
    wherein the protection layer includes metal oxide that contains at least one selected from the first metal and the second metal.

12. A magnetic memory device, comprising:
    a top electrode on a substrate;
    a magnetic tunnel junction pattern between the substrate and the top electrode;
    a bottom electrode between the substrate and the magnetic tunnel junction pattern; and a protection layer on a lateral surface of the magnetic tunnel junction pattern,
wherein the magnetic tunnel junction pattern includes:
a tunnel barrier pattern;
a free magnetic pattern between the tunnel barrier pattern and the top electrode;
a capping pattern between the free magnetic pattern and the top electrode; and
a first sub-pattern between the free magnetic pattern and the capping pattern,
wherein the capping pattern includes:
a lower capping patter including a non-magnetic metal;
a first non-magnetic pattern between the lower capping pattern and the top electrode, the first non-magnetic pattern including a first metal; and
a second non-magnetic pattern between the first non-magnetic pattern and the top electrode, the second non-magnetic pattern including a second metal different from the first metal, and the protection layer including metal oxide that contains at least one selected from the first metal and the second metal,
wherein the first sub-pattern has an upper surface contacting the non-magnetic metal of the lower capping pattern and a lower surface contacting the free magnetic pattern.

13. The magnetic memory device of claim 12, wherein an oxidation potential of the second metal is greater than an oxidation potential of the first metal.

14. The magnetic memory device of claim 13, wherein each of the first non-magnetic pattern and the second non-magnetic pattern has a thickness in a direction perpendicular to a top surface of the substrate, and the thickness of the second non-magnetic pattern is greater than the thickness of the first non-magnetic pattern.

15. The magnetic memory device of claim 12, wherein the capping pattern further includes
an upper capping pattern between the top electrode and the second non-magnetic pattern, each of the lower capping pattern and the upper capping pattern including a non-magnetic metal different from the first metal and the second metal.

16. The magnetic memory device of claim 12, wherein the first sub-pattern includes metal oxide.

17. The magnetic memory device of claim 12, wherein the magnetic tunnel junction pattern further includes a pinned magnetic pattern between the tunnel barrier pattern and the bottom electrode, and
each of the free magnetic pattern and the pinned magnetic pattern has a magnetization direction perpendicular to an interface between the free magnetic pattern and the tunnel barrier pattern.

18. The magnetic memory device of claim 12, wherein the first metal is Ta, and
the second metal is Hf, Zr, Sr, Sc, Y, Ca, Be, Ba, or Ti.

* * * * *